United States Patent [19]
Morita

[11] Patent Number: 5,961,794
[45] Date of Patent: Oct. 5, 1999

[54] METHOD OF MANUFACTURING SEMICONDUCTOR DEVICES

[75] Inventor: Tomotake Morita, Tokyo, Japan

[73] Assignee: NEC Corporation, Tokyo, Japan

[21] Appl. No.: 08/726,466

[22] Filed: Oct. 4, 1996

[30] Foreign Application Priority Data

Oct. 5, 1995 [JP] Japan ..................................... 7-258668

[51] Int. Cl.$^6$ ............................ C23C 14/34; C23C 14/46
[52] U.S. Cl. .................... 204/192.34; 438/759; 438/706; 438/761; 216/38
[58] Field of Search ................................. 216/17, 19, 38, 216/49; 438/690, 706, 759, 761, 778; 204/192.34

[56] References Cited

U.S. PATENT DOCUMENTS

| | | | |
|---|---|---|---|
| 4,654,120 | 3/1987 | Dougherty | 156/651 |
| 4,714,520 | 12/1987 | Gwozdz | 437/228 |
| 4,954,459 | 9/1990 | Avazino et al. | 437/228 |
| 5,229,316 | 7/1993 | Lee et al. | 437/67 |
| 5,575,886 | 11/1996 | Murase | 156/636.1 |

FOREIGN PATENT DOCUMENTS 0 199 965  12/1986  European Pat. Off. ........ H01L 21/76
0 545 263  6/1993  European Pat. Off. ........ H01L 21/76

OTHER PUBLICATIONS

English Abstract of JP 5–102100, Apr. 23, 1993.
L.F. Johnson, "Planarization of patterned surfaces by ion beam erosion", Appl. Phys. Lett., 40(7), Apr. 1, 1982.
"Shallow Trench Isolation for Ultra–Large–Scale Integrated Devices", K. Blumenstock et al., J. Vac. Sci. Techol. B 12(1), Jan./Feb. 1994 pp. 54–57.

*Primary Examiner*—Nam Nguyen
*Assistant Examiner*—Steven H. Ver Steeg
*Attorney, Agent, or Firm*—Foley & Lardner

[57] ABSTRACT

A method of manufacturing semiconductor devices that provides excellent controllability and workability in planarizing the isolation area. The novel method comprises the steps of: forming a filling material on a semiconductor substrate formed with a plurality of trenches such that the plurality of trenches are filled up with the filling material; forming a mask having a pattern obtained by inverting a pattern of the plurality of trenches onto the surface of the filling material; etching the filling material to a predetermined depth by use of the mask to leave a protruding portion composed of the filling material on each of the plurality of trenches; and removing the mask and then the protruding portion for planarization.

11 Claims, 9 Drawing Sheets

METHOD OF MANUFACTURING SEMICONDUCTOR DEVICES

BACKGROUND OF THE INVENTION

1. Field of the Invention

The present invention relates to a method of manufacturing semiconductor devices and, more particularly, to a method of manufacturing semiconductor devices having trench isolation.

2. Description of Related Art

For highly integrated semiconductor devices, an isolation area between circuit elements, such as transistors, needs to be as narrow as possible to enhance integration. The conventional isolation based on LOCOS (Local Oxidation of Silicon) cannot prevent a bird's beak defect from occurring, thereby failing to narrow the isolation area any further. Highly integrated devices also require multi-level interconnection technology. Implementation of this technology primarily requires planarization of the semiconductor substrate to prevent interconnected wiring from being disconnected at steps produced by raggedness for example, if any, on the substrate. Thus, planarization is often required in manufacturing semiconductor devices. To obtain the best planarization result, planarization needs to be practiced starting with as early a manufacturing step as possible. To meet this requirement, planar trench isolation that enables inter-element isolation with a relatively small area is produced. In trench isolation, trenches formed on the semiconductor substrate are filled up with an isolation material to provide inter-element isolation. This method is effective in forming trenches microscopically; excess filling material forming protrusions, however needs to be removed flatly.

FIGS. 1A through 1C show a method of forming trench isolation. In this method, a trench 3 is first formed outside the element forming area on the substrate as shown in FIG. 1A and then the formed trench is filled up with a filling material 4 by a depositing process such as CVD (Chemical Vapor Deposition) as shown in FIG. 1B. In the process, the filling material is deposited thick also outside the trench 3 to form a protrusion 8. This protrusion 8 is abraded planar as shown in FIG. 1C. Reference numeral 2 indicates a stopper layer serving to block abrasion. If the filling material is $SiO_2$ for example, the stopper layer 2 is formed by a material, $Si_3N_4$ for example, which is lower than $SiO_2$ in the rate at which the material is abraded.

If, in the above-mentioned method, a wide protruding area 8a, a wide protruding area 8b caused by closely arranged narrow recesses, and a wide area 9 are formed by the trench filling as shown in FIG. 2A, then performing abrasion on the protruding areas with the trench 3 filled causes abrasion pattern dependency as shown in FIG. 2B. In the wide recess area 9, film thinning is caused by the deformation of abrasive cloth during abrasion. In the wide protruding area 8a and the area 8b where the wide protrusion has been formed after filling, a filling material 4a is left unabraded at generally the center of each of these areas. Therefore, in the following process, when the stopper layer 2 made of $Si_3N_4$ for example is removed by hot phosphoric acid for example, the filling material 4a made of $SiO_2$ and the like on $Si_3N_4$ is detached, causing particles. If too much abrasion is performed to attempt the total removal of the excess filling material, the film in the wide recess area is thinned even further, losing planarity.

To overcome this problem, J. Vac. Technol. B12 (1), January/February 1994, pp. 54 through 57 proposes a technique as shown in FIGS. 3A through 3H. As shown, an $SiO_2$ film and a stopper layer 2 made of $Si_3N_4$ for example are formed on a substrate 1 to be patterned by lithography and dry etching. Further, anisotropic etching is performed on the isolation area where the surface of the substrate with the film removed is exposed, forming a trench 3 about 0.4 micron deep (FIG. 3A). The filling material 4 made of $SiO_2$ is formed such that the same fills up the trench 3 (FIG. 3B), on which polycrystalline silicon 10 and then a second $SiO_2$ film are formed (FIG. 3C). On the second $SiO_2$ film, a photo resist 5 is formed (FIG. 3D) and patterning is performed such that the second $SiO_2$ film remains only on the wider recess portion (FIG. 3E). The protruding polycrystalline silicon 10 is removed by abrasion with the second $SiO_2$ film 11 serving as the stopper layer (FIG. 3F). Then, the remaining polycrystalline silicon 10 used as the mask, the filling material 4 made of $SiO_2$ is etched (FIG. 3G). At this moment, the stopper layer 2 made of $Si_3N_4$ works as the stopper against the etching of the filling material $SiO_2$. Then, the protruding portions composed of the remaining polycrystalline silicon 10 and the filling material 4 are removed by abrasion for planarization (FIG. 3H). At this moment, the stopper layer 2 made of $Si_3N_4$ works as the stopper layer against the abrasion of the filling material 4.

However, this conventional method requires to prepare an entirely new mask for patterning the second $SiO_2$ film 11 that works as the stopper layer against the first abrasion of the polycrystalline silicon 10. This conventional method also requires relatively many manufacturing steps because film forming of the polycrystalline silicon 10 must be performed once, lithographing once, and abrasion of the polycrystalline silicon 10 twice.

SUMMARY OF THE INVENTION

It is therefore an object of the present invention to provide a semiconductor device manufacturing method of planarizing a filling material protruding from trenches without leaving any excess filling material on the element forming area but not thinning the filling material film on the isolation area with less manufacturing steps than those of the prior-art technology.

In carrying out the invention and according to the basic aspect thereof, there is provided a method of manufacturing semiconductor devices comprising the steps of: forming a filling material on a semiconductor substrate formed with a plurality of trenches such that the plurality of trenches are filled up with the filling material; forming a mask having a pattern obtained by inverting a pattern of the plurality of trenches onto the surface of the filling material; etching the filling material to a predetermined depth by use of the mask to leave a protruding portion composed of the filling material on each of the plurality of trenches; and removing the mask and then the protruding portion for planarization.

In the above-mentioned basic aspect, the protruding portion is preferably removed by ion radiation all over the semiconductor substrate or abrasion for planarization.

As described and according to the present invention having the above-mentioned aspect, the mask having the pattern obtained by inverting the pattern of the trenches is formed on the surface of the filling material and the filling material is etched to the predetermined depth by use of this mask to leave the protruding portion composed of the filling material on the plurality of trenches, resulting in a reduced amount of the filling material to be removed in planarization as compared with that of the conventional technology. Thus, the novel constitution can planarize the filling material without leaving the filling material on the wide element forming area and thinning the film of the filling material on the wide isolation area with less manufacturing steps than those of the conventional technology.

The above and other objects, features and additional objects of the present invention will become manifest to those versed in the art upon making reference to the following detailed description and accompanying drawings in which preferred embodiments incorporating the principles of the present invention are shown by way of illustrative example.

BRIEF DESCRIPTION OF THE DRAWINGS

FIGS. 4E-2 through 4G-2 are cross sectional view sequentially illustrating manufacturing steps practiced as a second preferred embodiment of the present invention;

DETAILED DESCRIPTION OF PREFERRED EMBODIMENTS

In order to make clearer the above-mentioned and additional objects and advantages of the present invention, the same will be described in further detail by way of several preferred embodiments with reference to the accompanying drawings.

First, the first embodiment of the present invention will be described with reference to FIGS. 4A through 4D and 4E-1 through 4G-1.

Figure 1A:
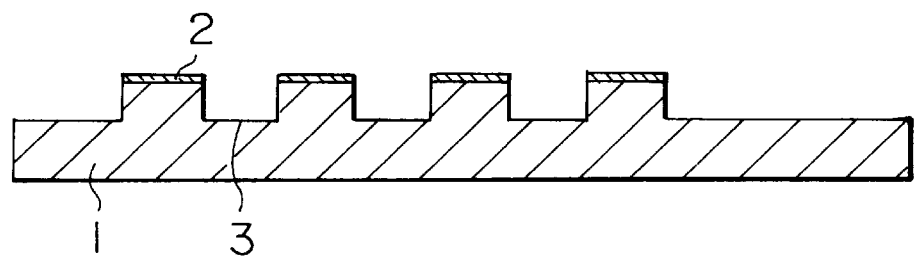
FIGS. 1A through 1C are cross sectional views sequentially illustrating the conventional manufacturing steps of semiconductor devices.
Figure 1B:
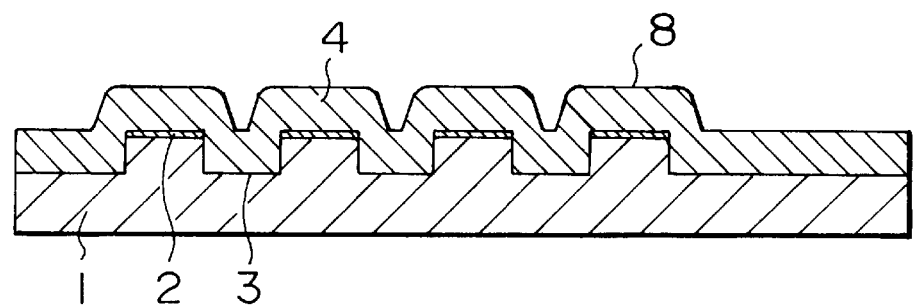
Figure 1C:
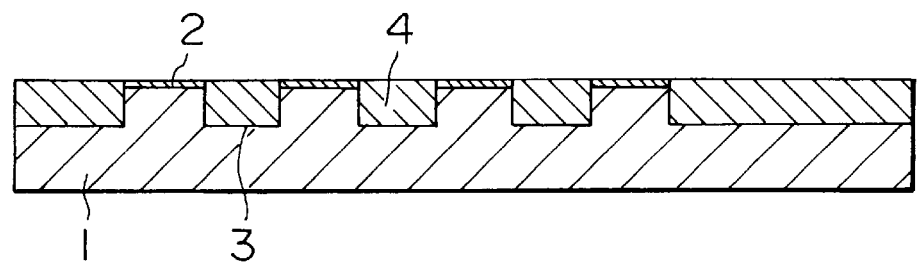
Figure 2A:
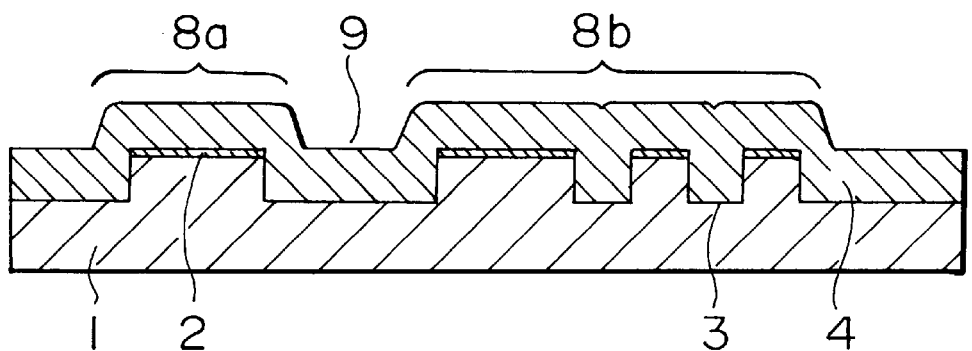
FIGS. 2A and 2B are cross sectional views for describing problems encountered in the conventional manufacturing steps.
Figure 2B:
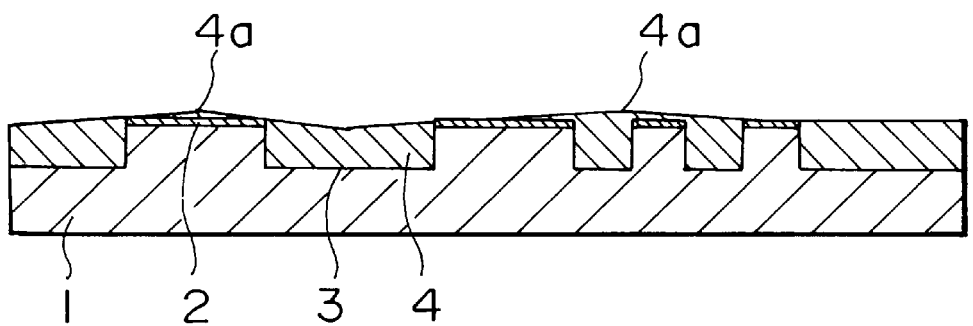
Figure 3A:
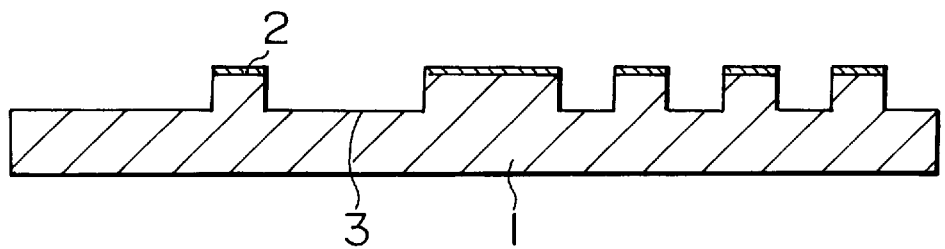
FIGS. 3A through 3H are cross sectional views sequentially illustrating other conventional manufacturing steps.
Figure 3B:
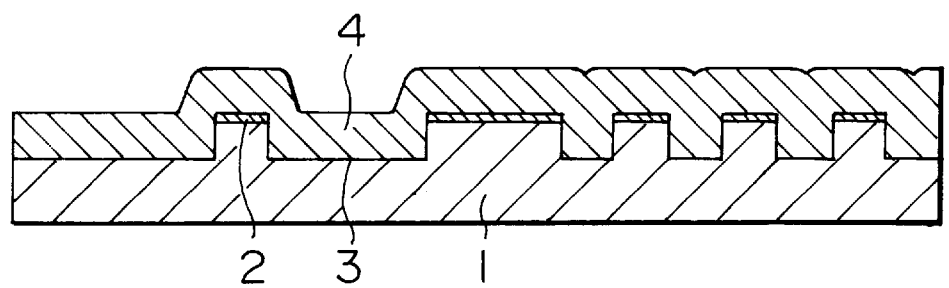
Figure 3C:
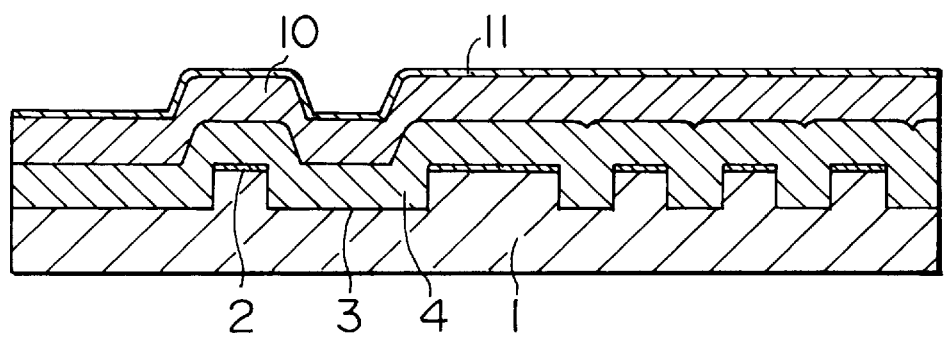
Figure 3D:
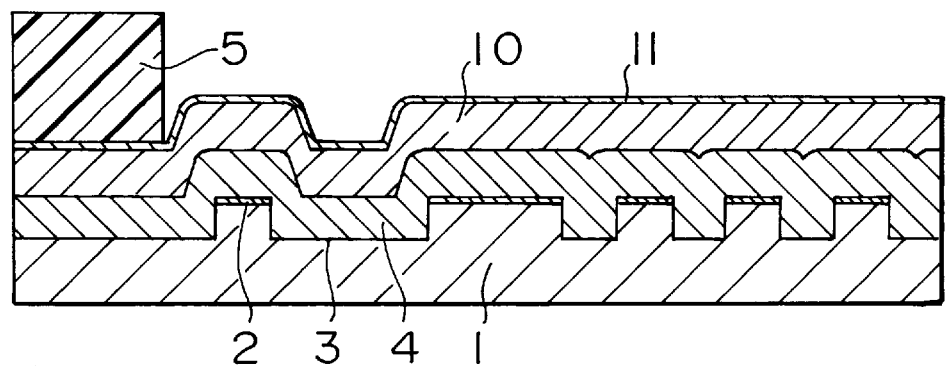
Figure 3E:
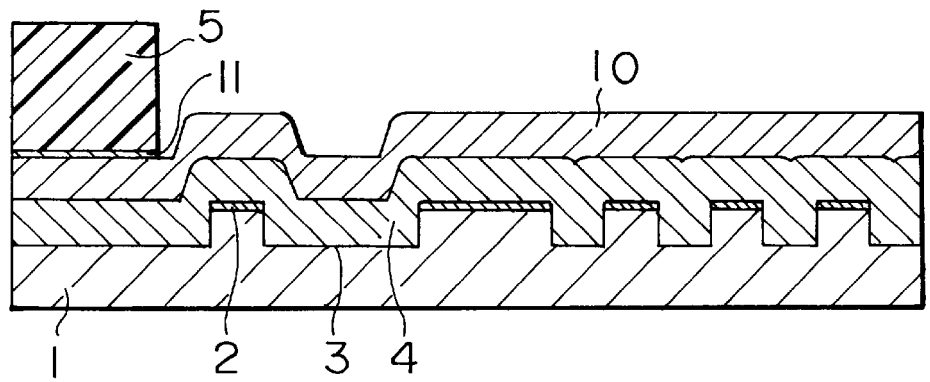
Figure 3F:
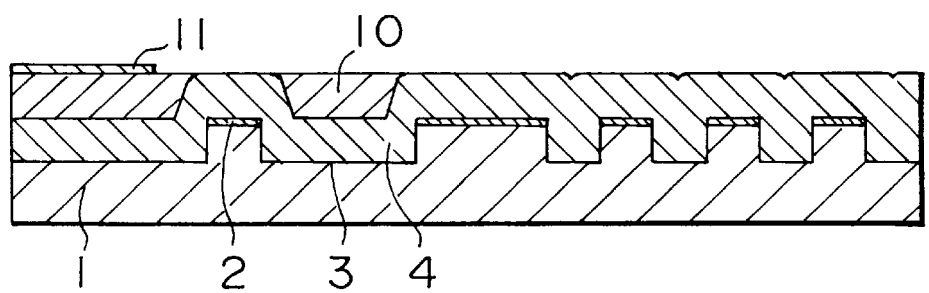
Figure 3G:
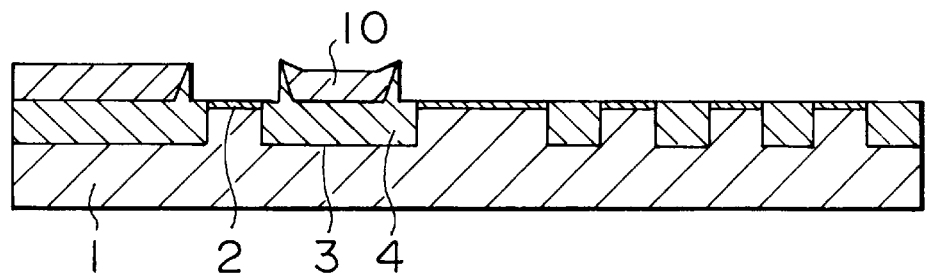
Figure 3H:
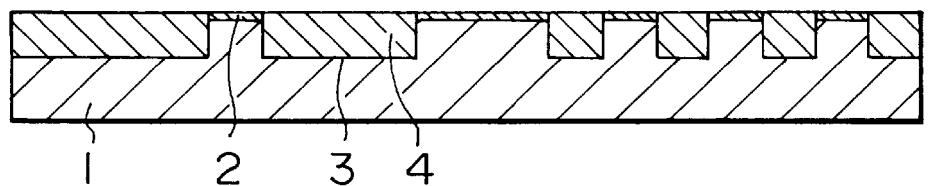
Figure 4A:
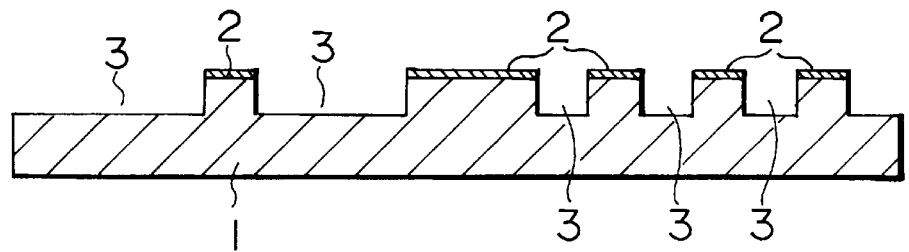
FIGS. 4A through 4D and 4E-1 through 4G-1 are cross sectional views sequentially illustrating manufacturing steps practiced as a first preferred embodiment of the present invention.
Figure 4B:
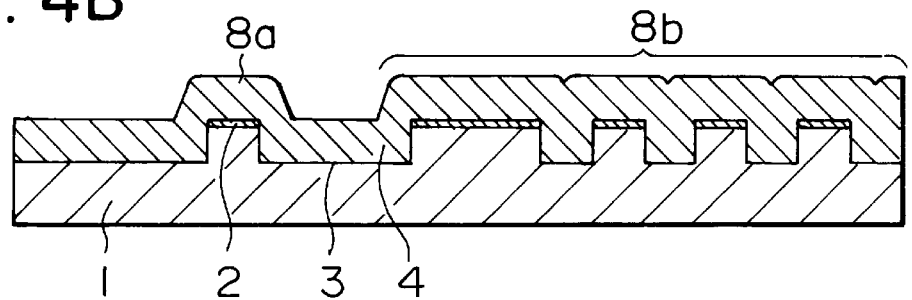
Figure 4C:
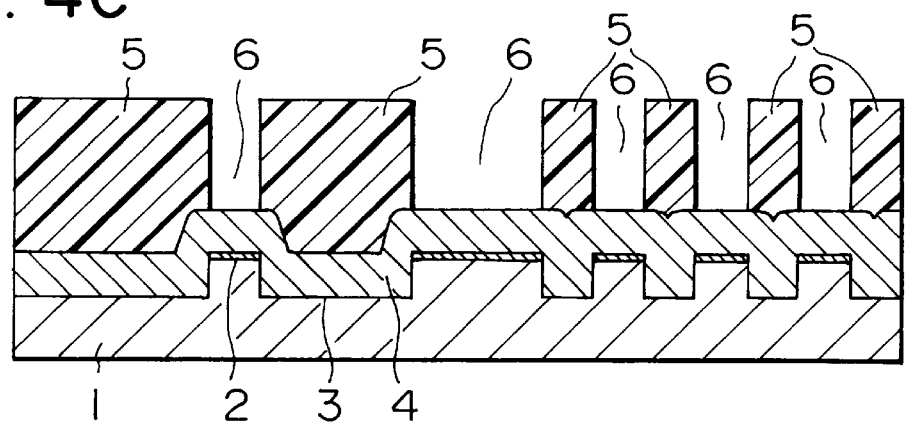
Figure 4D:
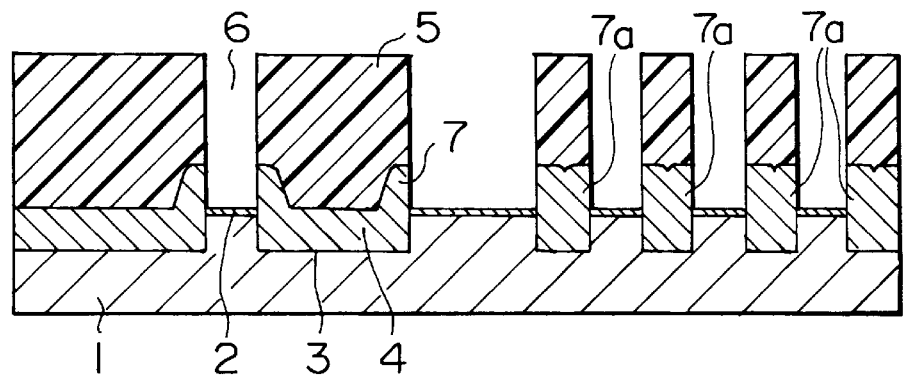
Figures 1, 4E:
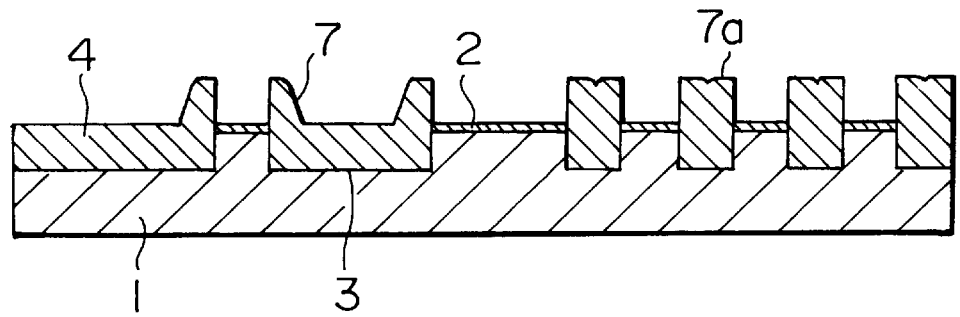
Figures 1, 4F:
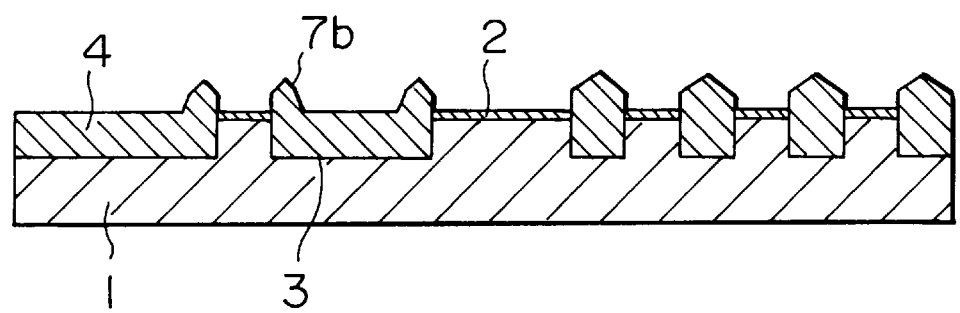
Figures 1, 4G:
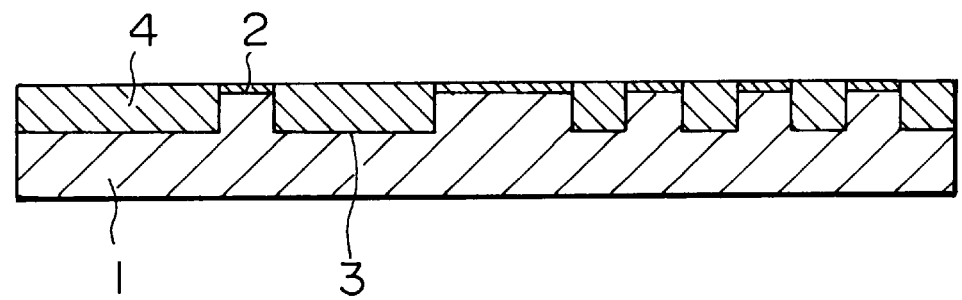

An $SiO_2$ film and a stopper layer 2 composed of an $Si_3N_4$ film for example are formed on a semiconductor substrate 1, on which patterning is performed by lithography and etching. Further, anisotropic etching is performed on the isolation area where the substrate 1 removed with the film is exposed to form a trench 3 about 0.4 micron deep as shown in FIG. 4A. Then, the trench 3 is filled up with the $SiO_2$ film, a filling material 4, by CVD as shown in FIG. 4B. At this time, the thickness of the filling material may be equal to the depth of the trench 3. Next, a photo resist 5 is formed on the filling material 4, the photo resist 5 having openings 6 immediately over the element forming area, namely an inverted pattern of the element forming area as shown in FIG. 4C. Then, the filling material 4 on the element forming area is removed by anisotropic etching by use of the photo resist 5 as the mask as shown in FIG. 4D. At this moment, the stopper layer 2 composed of the $Si_3N_4$ on the element forming area works as the etching stopper. This anisotropic etching leaves a protruding portion 7 composed of the filling material 4 immediately below the portion of the photo resist 5 around the opening 6 of the photo resist 5. Where the isolation area is relatively narrow in which a portion of the filling material 4 comes in contact with another at top of the trench when filling up the same, a protruding portion 7a having the width of the isolation area is formed. The widths of the protruding portion 7 and the protruding portion 7a can be adjusted by varying the exposure condition at forming the inverted pattern of the element forming area of the photo resist 5 and the etching condition at removing the filling material 4. Subsequently, the photo resist 5 is removed and Ar ions are radiated vertically on the semiconductor substrate 1 as shown in FIG. 4E-1. An incidence energy of Ar ions is preferably less than $10_2$ eV. By the radiation of Ar ions, the surface of the filling material 4 including the protruding portion 7 is subjected to a sputter-ion-etching. During this etching, the protruding portion 7 becomes a protruding portion 7b as shown in FIG. 4F-1. As the etching progresses, the protruding portion 7b is removed to generally planarize the surface of the filling material 4 as shown in FIG. 4G-1. When a positive photo resist is used, increasing the exposure at the time of forming the inverted pattern can make the size of the protruding portion 7 smaller. This in turn decreases the load of sputter etching.

Figure 5:
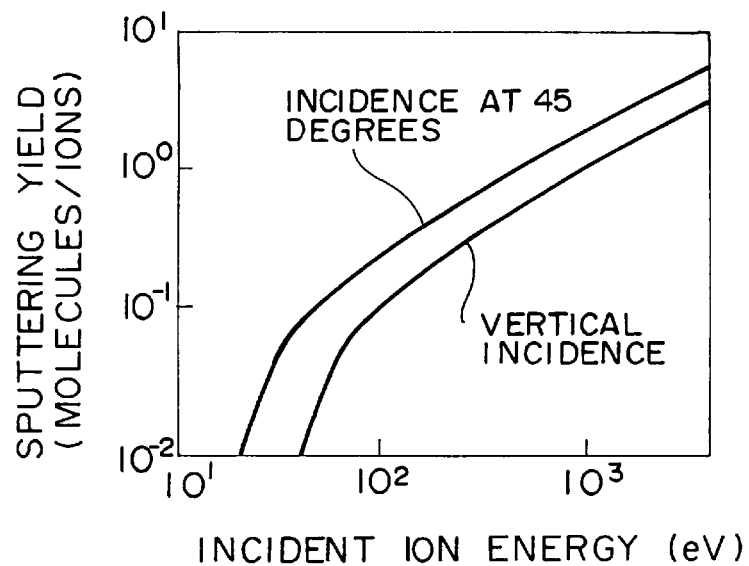
FIG. 5 is a graph indicating an incident ion energy dependency of sputtering yield for the etching step in the first preferred embodiment.

The following describes the sputter etching used in the first embodiment and an apparatus for use in the sputter etching. FIG. 5 is a graph indicating the incidence energy dependence of sputtering yield. As shown, when Ar ions are vertically radiated on the semiconductor substrate 1 as with the first embodiment, the sputtering yield of the $SiO_2$ film by the Ar ions is a primary function of the incident ion energy if the same is $10_2$ eV or higher; if the incident ion energy is below $10_2$ eV, the sputtering yield is a secondary function of the incident ion energy. If Ar ions are radiated at an angle of 45 degrees to the surface of the semiconductor substrate 1, a sputtering yield of the $SiO_2$ film by Ar ions is higher than that obtained by the vertical radiation. If the incident ion energy is 50 eV or higher, the sputtering yield is a primary function of the incident ion energy; if the incident ion energy is below 50 eV, the sputtering yield is a secondary function of the incident ion energy. Consequently, in an area where the Ar ion incident ion energy is lower, a ratio of the sputtering yield of the protruding portion 7 to that of the surface of the filling material 4 excluding the protruding portion 7 gets larger. If the incident ion energy is 75 eV, the etching rate of the protruding portion 7 is about four times as high as that of the surface of the filling material 4 excluding the protruding portion 7. If the incident ion energy is 40 eV, the etching rate of the protruding portion 7 is several ten times as high as that of the surface of the filling material 4 excluding the protruding portion 7. Consequently, the thickness of the etched filling material is generally equal to the thickness of the filling material at the time of filling.

For example, with the incident ion energy of 40 eV, etch selectivity of diagonal surface to vertical surface is relatively high at the cost of a lowered sputtering yield itself. Hence, even at a relatively low energy level, high-density ion radiation is required. An etching apparatus comprising an ordinary parallel plate electrode has a correlation between bias voltage and ion density, so that high-density ions cannot be obtained at a relatively low energy level.

Figure 6:
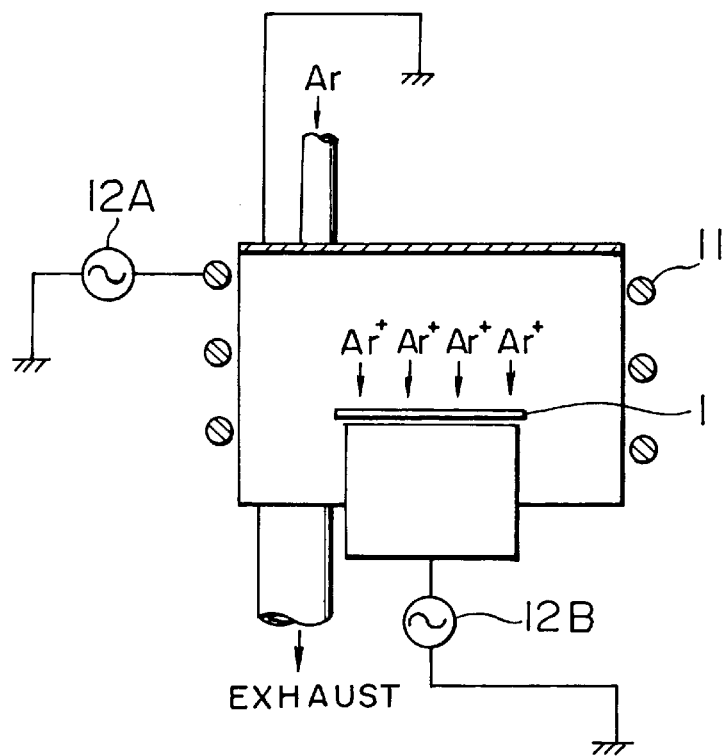
FIG. 6 is a schematic cross sectional view illustrating a sputter etching system for use in the first preferred embodiment.

Now, referring to FIG. 6, there is shown a schematic cross section of a sputter etching apparatus. In the sputter etching apparatus for performing the sputter etching of the first embodiment, an RF coil 11 for plasma generation is biased by a plasma generating high frequency power supply 12A and the semiconductor substrate 1 is biased by a substrate biasing high frequency power supply 12B. Thus, if the RF coil and the semiconductor substrate 1 are biased separately, high-density ions can be provided while keeping the substrate bias at a relatively low level. In addition to the above-mentioned apparatus, a down-flow asher or an ECR (Electron Cyclotron Resonance) ion etcher may be used. Further, even if the patterning is offset in forming the protruding portion 7, resulting in a change in the position or size of the protruding portion 7, the sputter etching can remove only the same, presenting no problem.

As described and according to the first preferred embodiment of the present invention, protruding portions can be selectively removed with ease when forming the generally planar filling material by removing the protruding portions thereof. Namely, the first embodiment provides excellent controllability and workability in planarizing the isolation area.

The following describes the method of manufacturing semiconductor devices practiced as a second preferred embodiment of the present invention with reference to cross sections indicating manufacturing steps sequentially.

Figures 2, 4E:
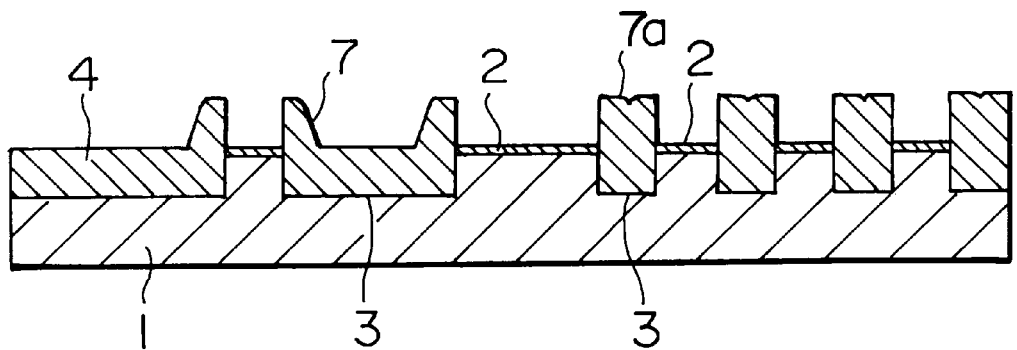
Figures 2, 4F:
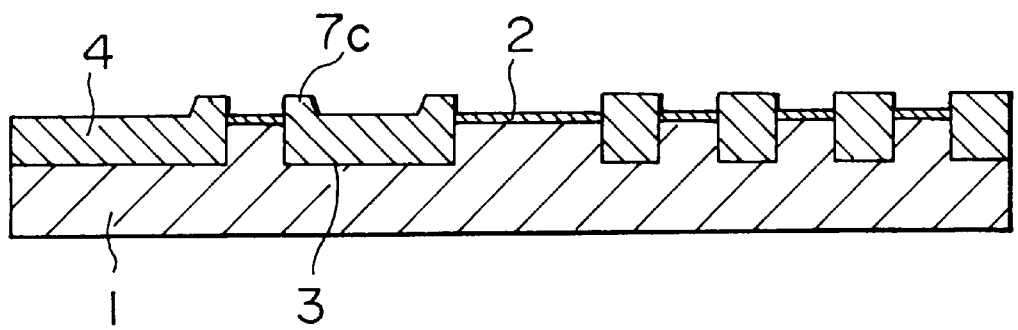
Figures 2, 4G:
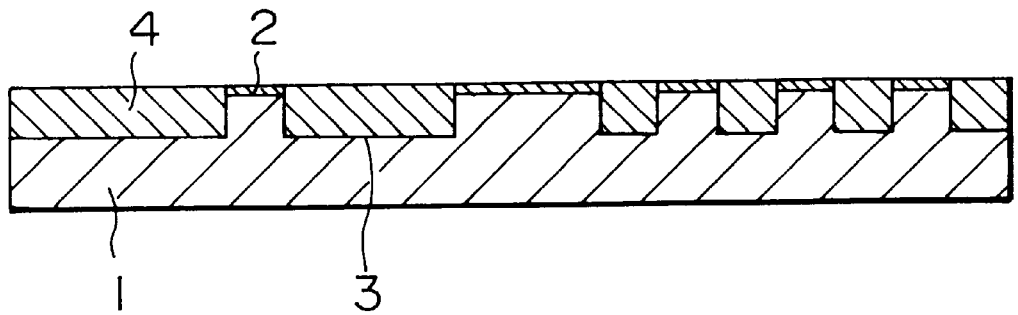

The manufacturing steps of the first embodiment shown in FIGS. 4A through 4D also hold true with the second embodiment. After completion of the step of FIG. 4D, the photo resist 5 is removed and then the protruding portions are abraded as shown in FIG. 4E-2. At this moment, the stopper layer 2 composed of the $Si_3N_4$ film on the element forming area works as the stopper against the abrasion. During the abrasion, the protruding portion 7 becomes a protruding portion 7c as shown in FIG. 4F-2. As the abrasion progresses, the protruding portion 7c is abraded off to generally planarize the filling material 4 as shown in FIG. 4G-2.

Figure 7:
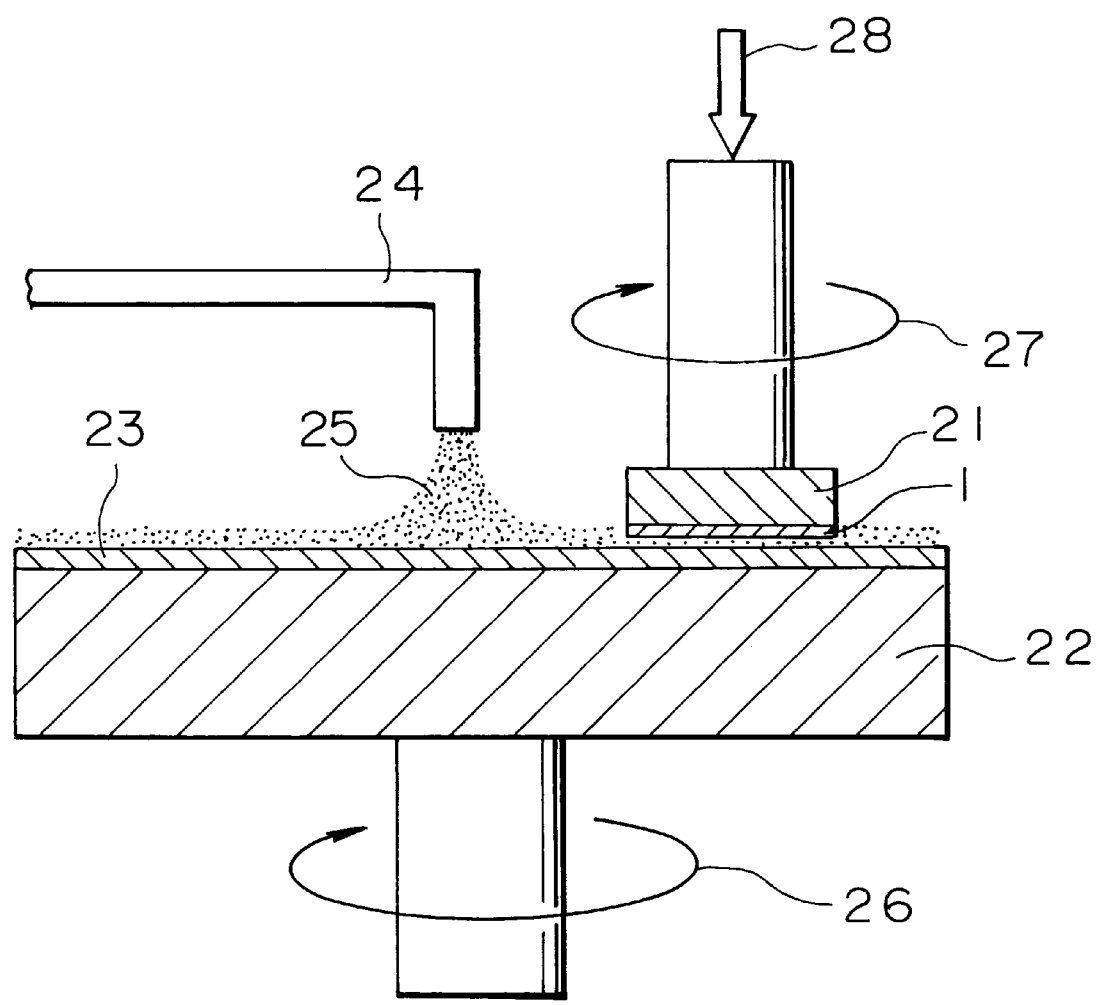
FIG. 7 is a schematic cross sectional view illustrating an abrading apparatus.

In what follows, abrasion practiced in the second embodiment will be described in detail. For an abrading apparatus, one as shown in FIG. 7 for example may be used. In the figure, a semiconductor substrate 1 is attached to a substrate holding member 21 with the front side of the substrate faced to a turn table 22. Then, while rotating the turn table 22 and the semiconductor substrate 1 (in the direction of arrows 26 and 27 respectively) at 30 rpm for example, the semiconductor substrate 1 is pressed in the direction of arrow 28 at a pressure of 400 $g/cm^2$ for example against an abrasive cloth 23 attached to the turn table 22 for abrasion. During abrasion, an abrasive 25, which is a liquid mixture of silica, KOH, and water for example is supplied from an abrasive supply port 24 to the abrasive cloth 23 at a rate of 200 cc/minute for example. At this moment, an abrading rate at which the semiconductor substrate 1 is abraded is proportional to the pressure at which the semiconductor substrate 1 is pressed against the abrasive cloth 23 with the abrasive 25 sufficiently supplied to the same. Consequently, a contact area between the protruding portion 7 to be removed and the abrasive cloth 23 in the present embodiment is smaller than a contact area at the time when the filling material 4 has not been removed from the element forming area, thereby increasing the pressure applied during abrasion, which in turn increases abrading rate. Further, because the portions to be removed are less in number than the case in which the filling material 4 has not been removed, abrasion can be performed in a relatively short time, thereby realizing planarization without the film thinning in a wide recess area caused by deformation of the abrasive cloth during abrasion. In addition, even if patterning is offset in forming the protruding portion 7, resulting in a change of the position or size of the same, no trouble occurs because only the protruding portion 7 is removed in this abrasion.

As described and according to the second preferred embodiment of the present invention, protruding portions can be selectively removed with ease when forming the generally planar filling material by removing the protruding portions thereof. Namely, the second embodiment provides excellent controllability and workability in planarizing the isolation area.

While the preferred embodiments of the present invention have been described using specific terms, such description is for illustrative purposes only, and it is to be understood that changes and variations may be made without departing from the spirit or scope of the appended claims.

What is claimed is:

1. A method of manufacturing semiconductor devices comprising the steps of:

forming a filling material on a semiconductor substrate having a plurality of trenches to fill said trenches;

forming a mask layer having an inverted pattern of said plurality of trenches on said filling material;

etching exposed portions of the filling material using said mask layer and leaving a protruding portion composed of said filling material on each of said plurality of trenches; and removing said mask layer and then said protruding portion for planarization using only ion radiation.

2. The method of manufacturing semiconductor devices according to claim 1, wherein a stopper layer is formed on a surface of said semiconductor substrate between said plurality of trenches, said stopper layer also being formed between said semiconductor substrate surface and said filling material, said stopper layer working as an etching stopper during the step of etching said filling material.

3. The method of manufacturing semiconductor devices according to claim 2 wherein said protruding portion is removed by ion radiation all over said semiconductor substrate for planarization.

4. The method of manufacturing semiconductor devices according to claim 3 wherein said ion radiation is performed onto the surface of said semiconductor substrate vertically.

5. The method of manufacturing semiconductor devices according to claim 4, wherein the protruding portions are removed using sputter ion etching for planarization.

6. The method of manufacturing semiconductor devices according to claim 3, wherein the protruding portions are removed using sputter ion etching for planarization.

7. The method of manufacturing semiconductor devices according to claim 1, wherein the protruding portions are removed by radiating ions all over said semiconductor substrate for planarization.

8. The method of manufacturing semiconductor devices according to claim 7, wherein said ions are radiated vertically onto the surface of said semiconductor substrate.

9. The method of manufacturing semiconductor devices according to claim 8, wherein the protruding portions are removed using sputter ion etching for planarization.

10. The method of manufacturing semiconductor devices according to claim 7, wherein the protruding portions are removed using sputter ion etching for planarization.

11. A method of manufacturing semiconductor devices comprising the steps of:

forming a stopper layer on element forming areas of a semiconductor substrate;

forming a plurality of trenches on a surface of said semiconductor substrate outside said element forming areas;

forming an insulation film over said semiconductor substrate to fill said plurality of trenches and to cover said stopper layer;

forming a mask layer having a pattern on said insulation film, said mask pattern having an opening over each of said element forming areas;

exposing said stopper layer by etching said insulation film using said mask layer as a mask, and forming a protruding portion composed of said insulation film protruding from each of said plurality of trenches; and removing said mask layer and then the protruding portions for planarizing the surface of said semiconductor substrate using only ion radiation.

* * * * *